United States Patent [19]

Rinaldi

[11] 4,427,948
[45] Jan. 24, 1984

[54] PULSE TOGGLE MONITOR CIRCUIT

[75] Inventor: Gerald M. Rinaldi, Mundelein, Ill.

[73] Assignee: GTE Automatic Electric Labs Inc., Northlake, Ill.

[21] Appl. No.: 332,920

[22] Filed: Dec. 21, 1981

[51] Int. Cl.³ .............................................. H03D 3/04
[52] U.S. Cl. .................................. 328/138; 307/523; 307/247 A; 328/120
[58] Field of Search .......................... 307/523, 247 A; 328/138, 120

[56] References Cited

U.S. PATENT DOCUMENTS

| | | | |
|---|---|---|---|
| 3,588,548 | 6/1971 | Williams | 307/523 |
| 3,753,130 | 8/1973 | Pezzutti | 328/138 |
| 4,002,987 | 1/1977 | Kuhn | 328/138 |
| 4,360,782 | 11/1982 | Nowell | 307/523 |

Primary Examiner—John S. Heyman
Attorney, Agent, or Firm—Gregory G. Hendricks; Robert J. Black

[57] ABSTRACT

A pulse toggle monitor circuit which detects toggling of a monitored pulse. A plurality of detection circuits are connected in a shift register manner. This arrangement provides for detection of pulse toggling of a duration longer than a predetermined time as defined by the period of an external reference signal and the number of detection circuits. The output of the shift register is connected to a storage circuit which is clocked by the reference signal and operates to store failure signals from the shift register. The storage circuit can be cleared either by external control or detection of a valid pulse.

9 Claims, 1 Drawing Figure

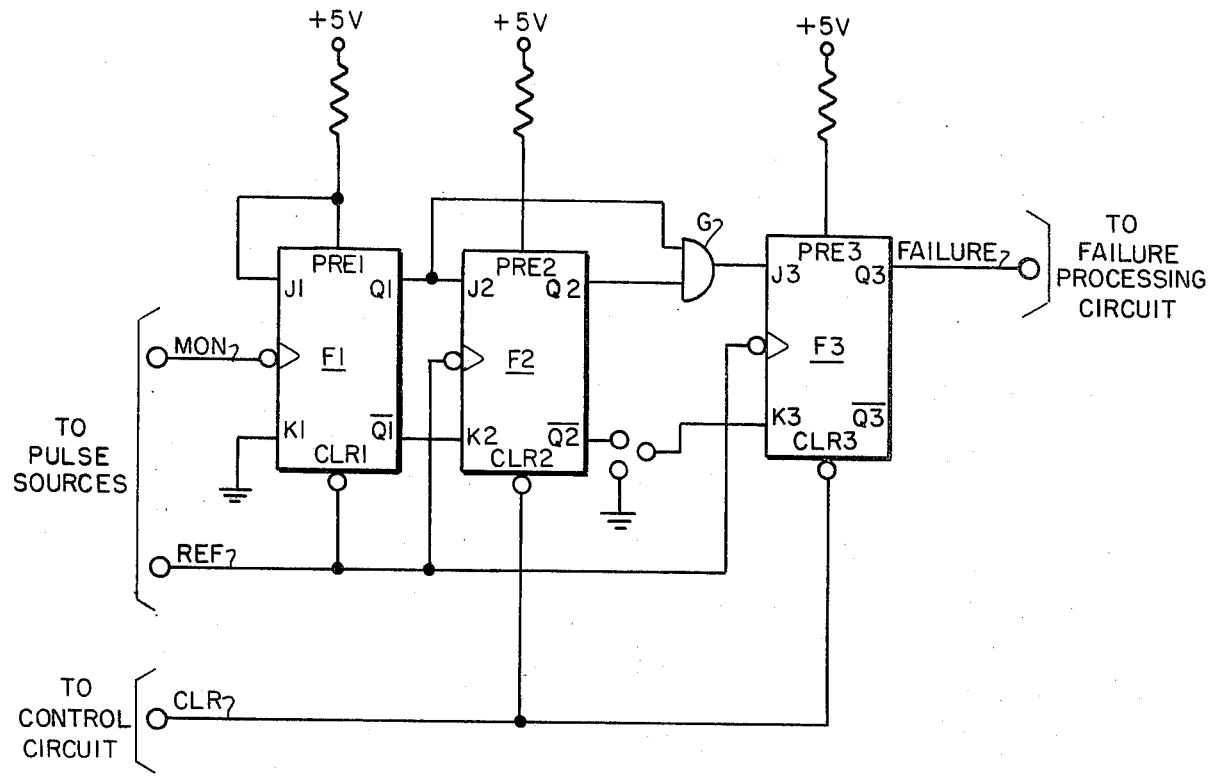

PULSE TOGGLE MONITOR CIRCUIT

BACKGROUND OF THE INVENTION (1) Field of the Invention

The present invention relates to digital switching systems and more particularly to a pulse toggle monitor circuit for use in such switching systems.

(2) Description of the Prior Art

Pulse toggle monitor circuits detect the duration of toggling of a monitored pulse. Typical pulse toggle monitor circuits (e.g. contact bounce circuits), while being old and well known, are usually analog rather than digital circuits. Pulse monitor circuits, by contrast, detect the presence or absence of a monitored pulse. These circuits do exist in digital form but they require complex logic circuitry and are sometimes unreliable and subject to race conditions. A recent advancement in the state of the art of pulse monitors was disclosed by H. Ballentine in an article entitled "Clock-Activity Detector Uses One DIP", Electronic Design News, Jan. 5, 1980, page 156. However, this circuit is still relatively complex and any detected failure signal is cleared when the monitored clock signal reappears. Some implementations of this circuit may also suffer from potential race problems due to inadequate clear signal pulse widths.

Accordingly it is the object of the present invention to provide a minimum component, highly reliable, digital pulse toggle monitor circuit, free of any potential race problems and resettable by either an external clear signal or appearance of a valid pulse.

SUMMARY OF THE INVENTION

The present invention is a circuit which detects toggling of a monitored pulse. If the duration of this toggling is in excess of a predetermined time threshold, a failure signal is provided. This circuit includes a plurality of detection circuits connected as a shift register. The output of the shift register is then connected to a storage circuit. The first detection circuit detects toggling of the monitored pulse during a predetermined time interval as defined by a reference signal. The output signal from the first detection circuit is then shifted into the next consecutive detection circuit in the shift register. If the first detection circuit again detects toggling of the monitored pulse during a subsequent reference signal time interval, it again generates a pulse detection signal. Each pulse detection signal is subsequently shifted through the next consecutive pulse detection circuit until the shift register reaches a maximum value. When the shift register reaches that value a toggling detected signal is applied to the storage circuit. The storage circuit then provides a failure signal. In one mode of operation the stored failure signal provides a failure indication even if a valid pulse reappears. Therefore, a failure condition can only be reset by an external clear signal. In an alternate mode of operation the failure condition will be cleared upon the appearance of a valid pulse.

When pulse toggling occurs the frequency of the monitored signal pulses is more than twice the frequency of the reference pulses. With this arrangement detection of pulse toggling during consecutive reference pulses results in a failure condition. By definition valid monitored pulses can not occur during two successive reference pulses.

DESCRIPTION OF THE DRAWING

A single FIGURE of the accompanying drawing is a logic diagram of a pulse toggle monitor circuit in accordance with the present invention.

DESCRIPTION OF THE PREFERRED EMBODIMENT

Referring now to the accompanying drawing, the pulse toggle monitor circuit of the present invention is shown. Outputs Q1 and $\overline{Q1}$ of JK flip-flop F1 are shown connected to input J2 and K2 of JK flip-flop F2. Outputs Q1 and Q2 are connected to input J3 of JK flip-flop F3 via gate G. Input K3 of flip-flop F3 is connectable to ground or to output $\overline{Q2}$ of flip-flop F2. Inputs J1 and K1 of flip-flop F1 are connected to plus 5 volts and ground respectively and the clock input of flip-flop F1 is connected to the source of clock pulses to be monitored. The clear input of flip-flop F1 and the clock inputs of flip-flops F2 and F3 are connected to an external reference signal source while the clear inputs of flip-flops F2 and F3 are connected to an external clear signal source. Output Q3 of flip-flop F3 provides a failure signal to external circuitry.

Flip-flops F1 and F2 are connected in a shift register arrangement and operate to detect pulse toggling of a duration longer than a predetermined time. Flip-flop F3 operates as a storage circuit to provide a failure signal to external circuitry.

When the pulse toggling failure condition occurs the frequency of the monitored signal pulses is more than twice the frequency of the reference pulses. With this arrangement detection of pulse toggling during consecutive reference pulses results in a failure condition. By definition, valid monitored pulses cannot occur during two successive reference pulses.

Flip-flop F1 is reset when a logic level 0 reference (REF) signal appears at its clear input. Flip-flops F2 and F3 are negative edge triggered flip-flops with zero hold time requirements for data with respect to the clock, and they therefore transfer data appearing at their J and K inputs to their Q and $\overline{Q}$ outputs when clocked by a negative going edge of the REF signal.

Since flip-flop F1 is reset for the duration of the low time (logic level 0) of every REF pulse, flip-flop F1 is capable of detecting a monitored pulse only during a high time (logic level 1) of an REF pulse. If a monitored pulse does appear during the high time of an REF pulse, flip-flop F1 transfers the logic level 1 and 0 signals appearing at its J1 and K1 inputs to its Q1 and $\overline{Q1}$ outputs, respectively, upon detection of a negative going edge of the monitored pulse. These logic level 1 and 0 signals also appear at the J2 and K2 inputs of flip-flop F2. Therefore, when flip-flop F2 is clocked on the negative going edge of the REF pulse it transfers these logic level 1 and 0 signals to its Q2 and $\overline{Q2}$ outputs, respectively. Flip-flop F1 is reset for the duration of the low time (logic level 0) of the REF signal and therefore, the Q1 and $\overline{Q1}$ outputs are reset to logic level 0 and 1 signals, respectively. Gate G then applies a logic level 0 signal to the J3 input of flip-flop F3, since the Q1 and Q2 outputs of flip-flops F1 and F2 are at logic levels 0 and 1, respectively. Normally a valid monitored pulse should not occur during the next REF pulse. Under these conditions, on the subsequent negative going edge of an REF pulse, the logic level 0 signal appearing at the J3 input of flip-flop F3 is transferred to the Q3 output. Therefore, there is no failure indication since there was no excessive pulse toggling lasting from one reference pulse to the next.

If however a monitored pulse was detected during the high time (logic level 1) of the second REF pulse, flip-flop F1 would again toggle and transfer the logic level 1 and 0 signals on its J1 and K1 inputs to its Q1 and $\overline{Q1}$ outputs, respectively. Therefore, logic level 1 signals from the Q1 and Q2 outputs of flip-flops F1 and F2 appear at the inputs to gate G which then applies a logic level 1 signal to the J3 input of flip-flop F3. Consequently, on the next negative going edge of the REF pulse, the logic level 1 signal appearing at the J3 input of flip-flop F3 is transferred to the Q3 output, thereby indicating a failure signal.

Since valid monitored pulses can occur only on every other reference pulse, reappearance of a valid monitored pulse results in absence of a monitored pulse during each second REF pulse. Since flip-flop F1 is reset by the logic level 0 portion of the REF signal it will remain reset with logic level 0 and 1 signals on its Q1 and $\overline{Q1}$ outputs, respectively, during the high time (logic level 1) of the REF signal if a monitored pulse does not appear during this time. Consequently, on the next negative going edge of the REF pulse, the logic level 0 and 1 signals appearing at the J2 and K2 inputs are transferred to the Q2 and $\overline{Q2}$ outputs, respectively. This results in a logic level 1 signal being applied to the K3 input of flip-flop F3 if the K3 input is connected to the $\overline{Q2}$ output. The logic level 0 signal on the Q1 output results in a logic level 0 signal being applied by gate G to the J3 input of flip-flop F3. Therefore, on the next negative going edge of an REF pulse, the logic level 0 and 1 signals, appearing at the J3 and K3 inputs, are transferred to the Q3 and $\overline{Q3}$ outputs of flip-flop F3, thereby removing the failure signal. Thus, if the K3 input of flip-flop F3 is connected to the $\overline{Q2}$ output of flip-flop F2, reappearance of a valid monitored pulse results in removal of the failure signal.

If the K3 input is connected to ground reappearance of a valid monitored pulse does not result in clearance of the failure signal and this signal can then only be cleared by an external clear signal being applied to the clear input of flip-flop F3. When a valid monitored pulse reappears flip-flops F1 and/or F2 are reset with logic level 0 and 1 signals appearing on their Q and $\overline{Q}$ outputs, respectively. However, flip-flop F3 does not reset on the next negative going REF pulse because logic level 0 signals appear at both its J3 and K3 inputs. A logic level 0 signal appears at the J3 input via gate G since either flip-flop F1 or F2 is reset with the logic level 0 signal appearing at its Q1 or Q2 output. While the $\overline{Q2}$ output of flip-flop F2 has a logic level 1 signal when it is reset this logic level 1 signal does not appear at the K3 input since that input is connected to ground. Therefore, logic level 0 signals appear at both the J3 and K3 inputs, and flip-flop F3 does not toggle under such conditions. Consequently, a failure signal is not cleared by reappearance of a monitored pulse when the K3 input is connected to ground, and under such circumstances the failure signal can only be cleared by an external clear signal. The present invention thus discloses a digital pulse toggle monitor circuit which detects pulse toggling of a duration longer than a predetermined time, as defined by the period of an external reference signal and the number of detection circuits. By adding additional detection circuits, arranged as flip-flop F2, the threshold for detection of excessive pulse toggling can be increased to any desired duration.

It will be obvious to those skilled in the art that numerous modifications of the present invention can be made without departing from the spirit of the invention which shall be limited only by the scope of the claims appended hereto.

What is claimed is:

1. A pulse toggle monitor circuit for use in a switching system, including a clock signal source normally operated to provide clock signal pulses of a first frequency, and abnormally operated to provide clock signal pulses of a higher frequency, and a reference signal source operated to provide reference signal pulses of first and second polarities and of a frequency at least twice the frequency of said clock signal pulses, said pulse toggle monitor circuit comprising:

first detection means connected to said clock signal source and said reference signal source, operated in response to each reference signal pulse of said first polarity and a contemporaneously occurring clock signal pulse to provide a first pulse detection signal;

said first detection means further operated in response to said reference signal pulse of said second polarity to clear said first pulse detection signal;

at least one other detection means connected in series with said first detection means and further connected to said reference signal source, operated in response to said pulse detection signal from an immediately preceding detection means, and said reference signal pulse of said second polarity to generate a subsequent pulse detection signal;

gating means connected to said first detection means and each other detection means, operated in response to contemporaneously occurring pulse detection signals from said first detection means and each other detection means to provide a pulse toggle detection signal; and storage means connected to said gating means and said reference signal source, operated in response to said pulse toggle detection signal and said reference signal pulse of said second polarity to provide a pulse toggle failure signal;

whereby said pulse toggle monitor circuit detects said clock signal pulses of said higher frequency.

2. A pulse toggle monitor circuit as claimed in claim 1, wherein: each other detection means is further operated in response to said cleared pulse detection signal from an immediately preceding detection means and said reference signal of said second polarity to clear said subsequent pulse detection signal.

3. A pulse toggle monitor circuit as claimed in claim 1, wherein there is further included:

a clear signal source; each other detection means further connected to said clear signal source and further operated in response to said clear signal to clear said subsequent pulse detection signal; and said storage means further connected to said clear signal source and further operated in response to said clear signal to clear said pulse toggle failure signal.

4. A pulse toggle monitor circuit as claimed in claim 1, wherein said first detection means comprises: a flip-flop having a clock input connected to said clock signal source, a clear input connected to said reference signal source, and first and second outputs providing said first pulse detection signal and an inverted first pulse detection signal respectively.

5. A pulse toggle monitor circuit as claimed in claim 1, wherein each other detection means comprises: a flip-flop having first and second data inputs connected to said first and second outputs of an immediately preceding detection means, a clock input connected to said reference signal source, and first and second outputs providing said subsequent pulse detection signal and an inverted subsequent pulse detection signal, respectively.

6. A pulse toggle monitor circuit as claimed in claim 1, wherein said gating means comprises: an AND gate connected to said first output of said first detection means and each other detection means.

7. A pulse toggle monitor circuit as claimed in claim 1, wherein said storage means comprises: a flip-flop having first and second data inputs connected to said gating means and ground respectively, and a clock input connected to said reference signal source.

8. A pulse toggle monitor circuit as claimed in claim 6, wherein: said storage means is further operated in response to an absence of said pulse toggle detection signal and said reference signal pulse of said second polarity to clear said pulse toggle failure signal.

9. A pulse toggle monitor circuit as claimed in claim 8, wherein said storage means comprises: a flip-flop having a first data input connected to said gating means and a second data input connected to said second output of the immediately preceding other detection means.

* * * * *